(12) United States Patent
Binnard

(10) Patent No.: US 6,844,694 B2
(45) Date of Patent: Jan. 18, 2005

(54) STAGE ASSEMBLY AND EXPOSURE APPARATUS INCLUDING THE SAME

(75) Inventor: Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/925,531

(22) Filed: Aug. 10, 2001

(65) Prior Publication Data

US 2003/0030402 A1 Feb. 13, 2003

(51) Int. Cl.$^7$ .............................................. B64C 17/06
(52) U.S. Cl. ............... 318/649; 318/568.1; 318/568.22; 318/575
(58) Field of Search ........................... 318/568.22, 575, 318/611, 632, 638, 648, 649, 687, 568.1

(56) References Cited

U.S. PATENT DOCUMENTS

| | | | |
|---|---|---|---|
| 5,528,118 A | | 6/1996 | Lee |
| 5,726,542 A | * | 3/1998 | Ebihara ..................... 318/135 |
| 5,815,246 A | | 9/1998 | Sperling et al. |
| 5,864,389 A | | 1/1999 | Osanai et al. |
| 5,959,427 A | | 9/1999 | Watson |
| 6,130,517 A | * | 10/2000 | Yuan et al. ................. 318/593 |
| 6,134,981 A | | 10/2000 | Novak et al. |
| 6,158,298 A | | 12/2000 | Hara |

FOREIGN PATENT DOCUMENTS

| | | |
|---|---|---|
| JP | 10-74685 | 3/1998 |
| JP | 11-168064 | 6/1999 |
| WO | WO 99/16080 | 4/1999 |

* cited by examiner

*Primary Examiner*—Marlon Fletcher
(74) *Attorney, Agent, or Firm*—Finnegan, Henderson, Farabow, Garrett & Dunner, LLP

(57) ABSTRACT

A stage assembly for an exposure apparatus is disclosed. The stage assembly comprises a guide assembly. The guide assembly includes a guide bar, a stage, a first actuator component, and a second actuator component. The guide bar is movable in a first direction and has a center of gravity and a guiding portion. The stage is movable along the guiding portion of the guide bar in a second direction substantially perpendicular to the first direction and exerts a reaction force on the guide bar. The stage has a center of gravity spaced apart from the center of gravity of the guide bar in the first direction. The first actuator component is positioned on the guide bar. The first actuator component is aligned with the center of gravity of the stage in the second direction to apply a compensating force on the guide bar to cancel the reaction force exerted by the stage. The second actuator component is positioned on the guide bar. The second actuator component is aligned with the center of gravity of the guide bar in the second direction to apply a force on the guide bar to control a position of the guide bar in the second direction.

23 Claims, 15 Drawing Sheets

STAGE ASSEMBLY AND EXPOSURE APPARATUS INCLUDING THE SAME

BACKGROUND OF THE INVENTION

The present invention relates generally to an exposure apparatus for exposing a pattern onto a semiconductor wafer. More particularly, the present invention relates to a stage assembly and an associated method for applying a compensating force to cancel a reaction force of a stage and an exposure apparatus, including the stage assembly, for manufacturing semiconductor wafers.

A stage assembly for an exposure apparatus typically includes a stage, which supports and moves a semiconductor wafer while the exposure apparatus transfers a circuit pattern onto the wafer. As the stage moves, however, it exerts a reaction force on other components of the stage assembly. This reaction force makes precise movement and positioning of the stage difficult because it tends to move and cause vibration on other components of the stage assembly. Accordingly, there is a need for a stage assembly that compensates for the reaction force exerted by a stage and thereby improves the exposure accuracy of an exposure apparatus.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, the invention is directed to a stage assembly comprising a guide assembly. The guide assembly includes a guide bar, a stage, and an actuator component. The guide bar is movable in a first direction and has a center of gravity and a guiding portion. The stage is movable along the guiding portion of the guide bar in a second direction substantially perpendicular to the first direction and exerts a reaction force on the guide bar. The stage has a center of gravity substantially positioned in a plane parallel to the first and second directions. The plane parallel to the first and second directions has the center of gravity of the guide bar substantially positioned therein. The actuator component is positioned on the guide bar substantially in the plane parallel to the first and second directions. The actuator component is aligned with the center of gravity of the stage in the second direction to apply a compensating force on the guide bar to cancel the reaction force exerted by the stage.

In another aspect, the present invention is directed to a stage assembly comprising a guide assembly. The guide assembly includes a guide bar, a stage, a first actuator component, and a second actuator component. The guide bar is movable on the base in a first direction and has a center of gravity and a guiding portion. The stage is movable along the guiding portion of the guide bar in a second direction substantially perpendicular to the first direction and exerts a reaction force on the guide bar. The stage has a center of gravity spaced apart from the center of gravity of the guide bar in the first direction. The first actuator component is positioned on the guide bar. The first actuator component is aligned with the center of gravity of the stage in the second direction to apply a compensating force on the guide bar to cancel the reaction force exerted by the stage. The second actuator component is positioned on the guide bar. The second actuator component is aligned with the center of gravity of the guide bar in the second direction to apply a force on the guide bar to control a position of the guide bar in the second direction.

In yet another aspect, the present invention is directed to a stage assembly comprising a guide assembly. The guide assembly includes a first moving member, a second moving member, and an actuator. The first moving member is movable in a first direction and has a center of gravity. The second moving member is movable in a second direction substantially perpendicular to the first direction. The second moving member has a center of gravity substantially positioned in a plane parallel to the first and second directions. The plane parallel to the first and second directions has the center of gravity of the first moving member substantially positioned therein. At least part of the actuator is positioned on the first moving member. The actuator generates a force acting on the first moving member in the second direction. A portion where the force acts on the first moving member is substantially positioned in the plane parallel to the first and second directions and aligned with the center of gravity of the second moving member in the second direction.

In yet another aspect, the present invention is directed to a stage assembly comprising a guide assembly. The guide assembly includes a first moving member, a second moving member, a first actuator, and a second actuator. The first moving member is movable in a first direction and has a center of gravity. The second moving member is movable in a second direction substantially perpendicular to the first direction. The second moving member has a center of gravity spaced apart from the center of gravity of the first moving member in the first direction. At least part of the first actuator is positioned on the first moving member. The first actuator generates a first force acting on the first moving member in the second direction. A first portion where the first force acts on the first moving member is substantially aligned with the center of gravity of the second moving member in the second direction. At least part of the second actuator is positioned on the first moving member. The second actuator generates a second force acting on the first moving member in the second direction. A second portion where the second force acts on the first moving member is substantially aligned with the center of gravity of the first moving member in the second direction.

In yet another aspect, the present invention is directed to a method for driving a stage assembly comprising a first moving member and a second moving member. The method comprising the steps of: driving the first moving member in a first direction; driving the second moving member in a second direction substantially perpendicular to the first direction; and applying a force on the first moving member at a portion in the second direction. A center of gravity of the first moving member and a center of gravity of the second moving member are substantially positioned in a plane parallel to the first and second directions. The portion is substantially positioned in the plane parallel to the first and second directions and aligned with the center of gravity of the second moving member in the second direction.

In yet another aspect, the present invention is directed to a method for driving a stage assembly comprising a first moving member and a second moving member. The method comprising the steps of: driving the first moving member in a first direction; driving the second moving member in a second direction substantially perpendicular to the first direction; applying a first force on the first moving member at a first portion in the second direction to cancel a reaction force exerted by the second moving member; and applying a second force on the first moving member at a second portion in the second direction to control a position of the first moving member in the second direction. The first portion is aligned with a center of gravity of the second moving member in the second direction. The second portion is aligned with a center of gravity of the first moving member in the second direction.

It is to be understood that both the foregoing general description and the following detailed description are exemplary and explanatory only and are not restrictive of the invention, as claimed.

Additional advantages will be set forth in the description which follows, and in part will be understood from the description, or may be learned by practice of the invention. The objects and advantages may be obtained by means of the combinations set forth in the attached claims.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Reference will now be made in detail to the presently preferred embodiments of the present invention, examples of which are illustrated in the accompanying drawings. Wherever possible, the same reference numbers will be used throughout the drawings to refer to the same or like parts.

For the purpose of the following description, unless stated otherwise, the coordinate system illustrated in each figure is arbitrary and applies in that figure only.

Also, unless stated otherwise, a direction refers to either a positive or negative vector of that direction. For example, unless specifically stated as the +X direction or −X direction, the X direction refers to either the +X or −X direction. Moreover, unless stated otherwise, a torque around an axis refers to either a clockwise or counterclockwise torque around the axis. For example, a torque around the X axis refers to either a clockwise or counterclockwise torque around the X axis.

Figure 1:
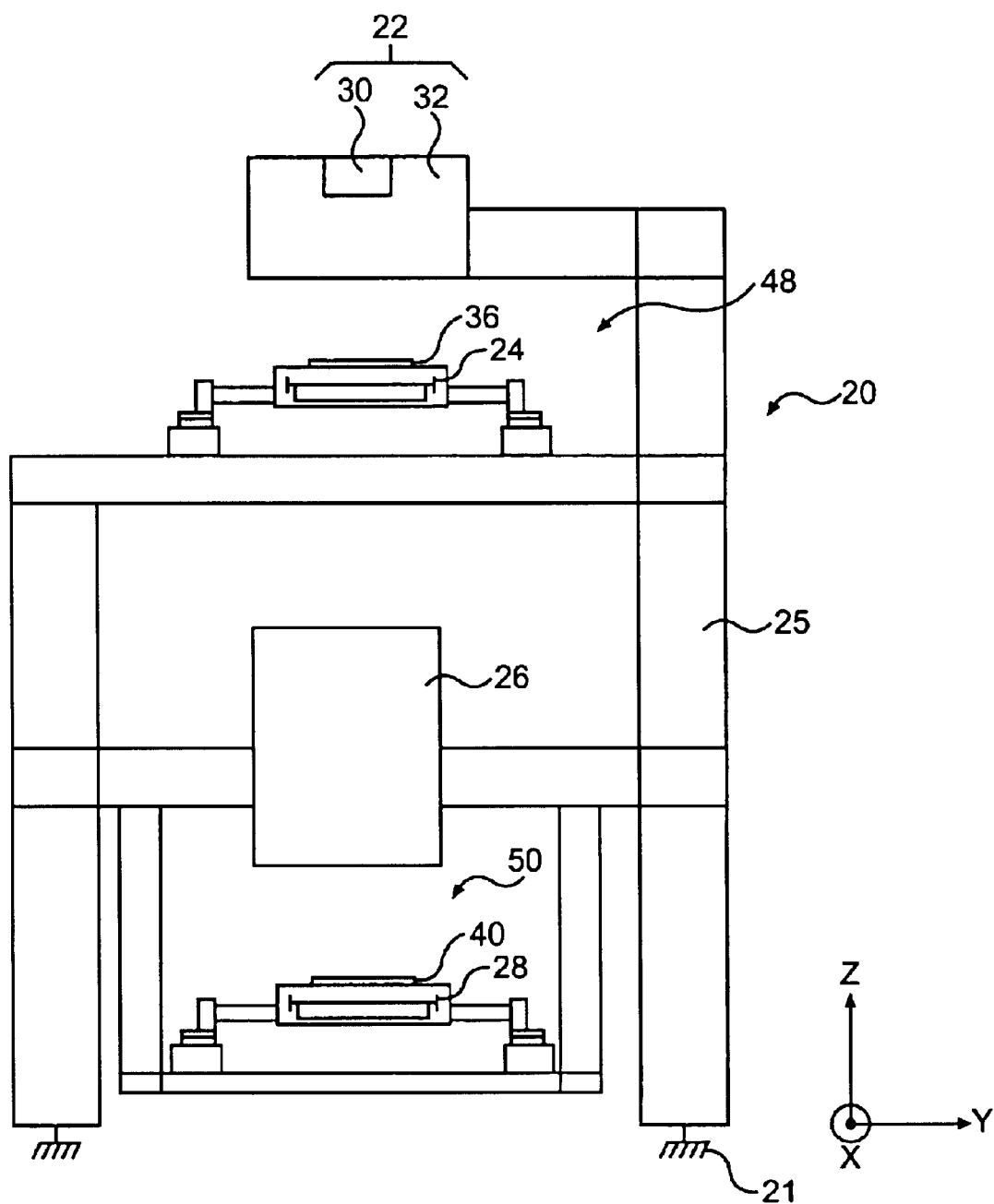
FIG. 1 is a side elevation view of an exposure apparatus having the features of the present invention.

In the embodiment illustrated in FIG. 1, an exposure apparatus for manufacturing semiconductor wafers is designated generally by reference number 20. As shown in FIG. 1, exposure apparatus 20 includes an illumination system 22 and a lens assembly 26. Illumination system 22 has an illumination source 30 emitting a beam and an illumination optical assembly 32 guiding the beam onto a reticle 36 containing a pattern of an integrated circuit to be transferred to a wafer 40. Lens assembly 26 projects the beam passed through reticle 36 onto wafer 40. Exposure apparatus 20 is designed to be mounted to a base 21, i.e., a floor or the ground or some other supporting structure.

An apparatus frame 25 is a rigid structure that supports the components of exposure apparatus 20 above base 21. Alternatively, separate, individual structures (not shown) can be used to support individual components of exposure apparatus 20 above base 21. The design of apparatus frame 25 may vary to suit the design requirements for the components of exposure apparatus 20.

In the embodiment illustrated in FIG. 1, exposure apparatus 20 includes a wafer stage assembly 50 and a reticle stage assembly 48. Wafer stage assembly 50 includes a wafer stage 28, which supports and positions wafer 40 with respect to lens assembly 26. Similarly, reticle stage assembly 48 includes a reticle stage 24, which supports and positions reticle 36 with respect to lens assembly 26.

For the purposes of illustrating the principles of the present invention, the following descriptions are directed to a wafer stage assembly. It should be noted, however, that the principles of the present invention can be readily applied to a reticle stage assembly as well.

Figure 2:
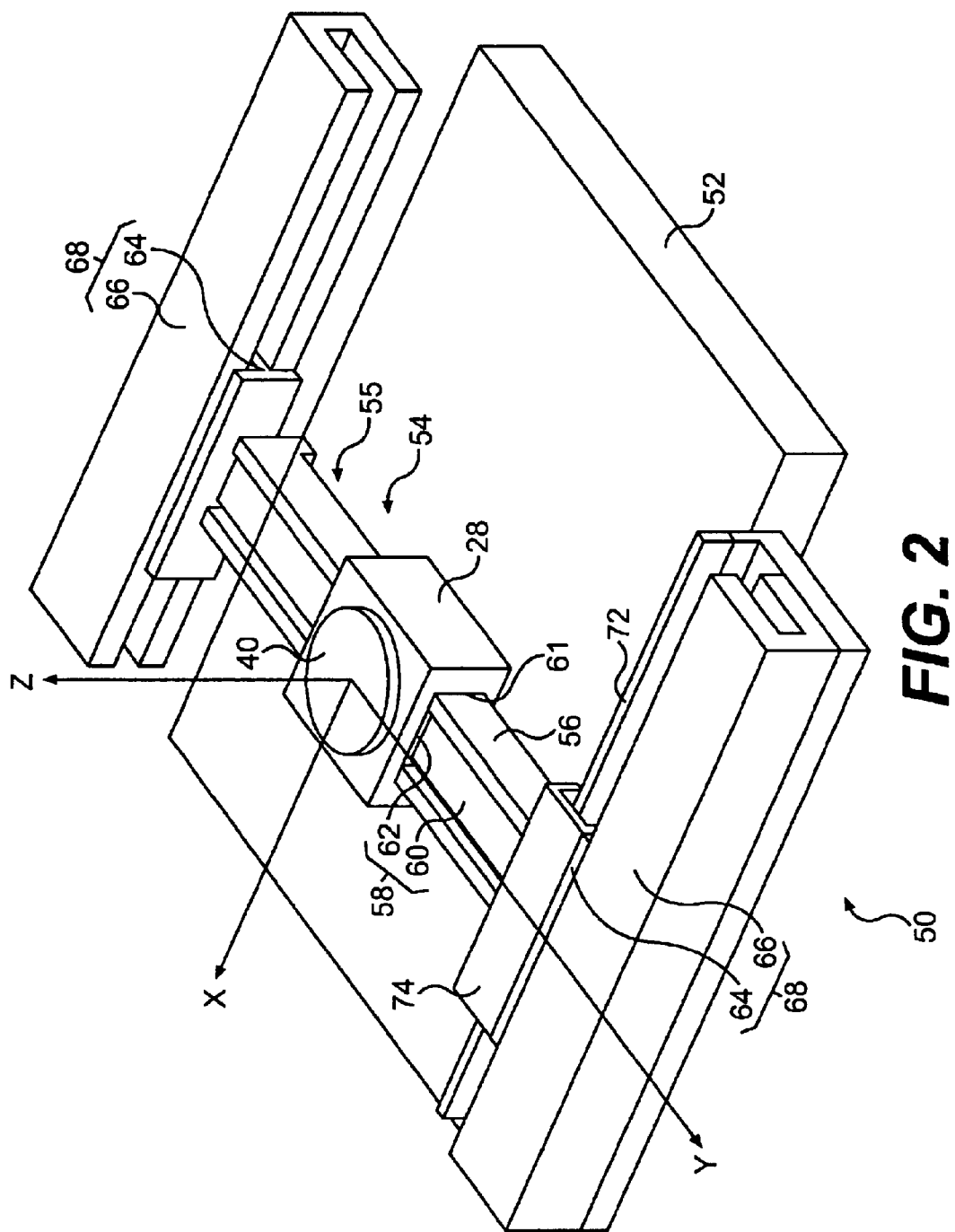
FIG. 2 is a perspective view of a wafer stage assembly shown in FIG. 1.
Figure 3:
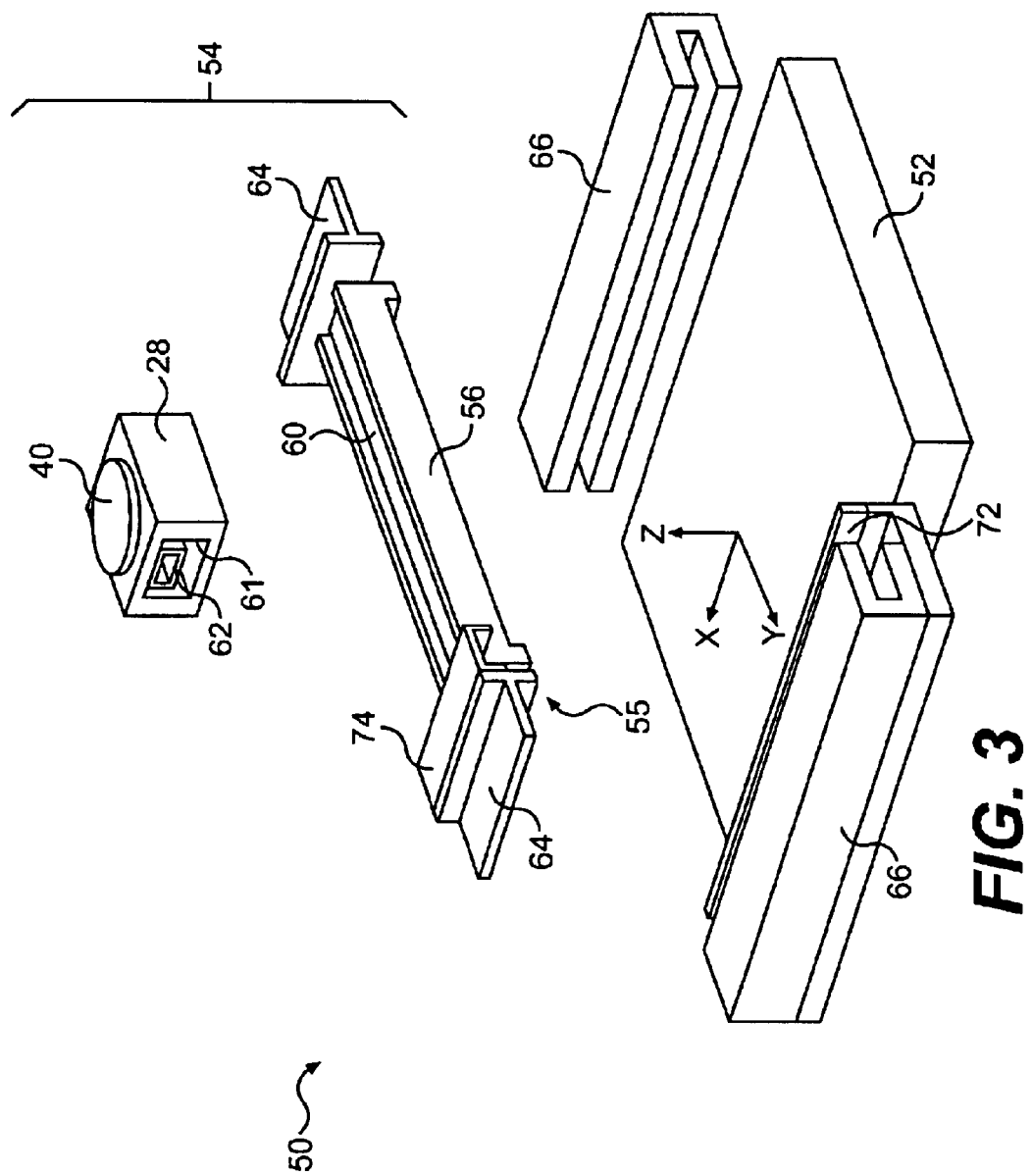
FIG. 3 is an exploded perspective view of the wafer stage assembly shown in FIG. 2.
Figure 4:
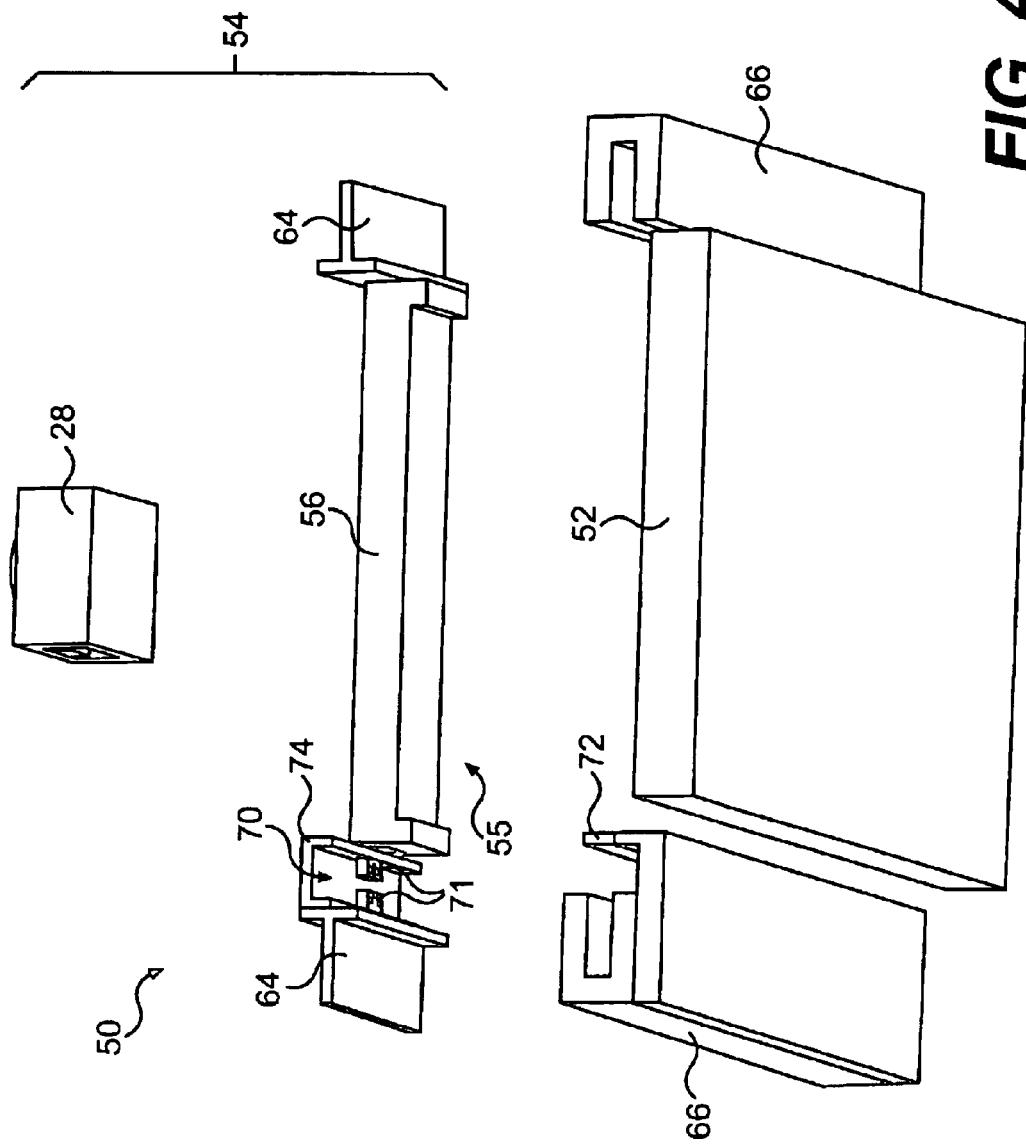
FIG. 4. is an exploded perspective view of the wafer stage assembly shown in FIG. 2 illustrating an actuator component.

FIGS. 2–4 illustrate a first embodiment of a wafer stage assembly 50. Wafer stage assembly 50 includes a base member 52 and a guide assembly 54. Guide assembly 54 in turn includes a guide bar 55 and stage 28. Stage 28 supports wafer 40 thereon using a vacuum chuck, an electrostatic chuck, or other type of clamp.

As illustrated in FIG. 2, stage 28 is mounted on a guiding portion 56 of guide bar 55 through an opening 61 and is movable along guiding portion 56 in the Y direction. To move stage 28 in the Y direction, guide assembly 54 includes a Y linear motor 58. Y linear motor 58 includes a Y coil 60 positioned on guiding portion 56 of guide bar 55 and a Y magnet 62 positioned within opening 61 of stage 28. By controlling the electromagnetic interaction between Y coil 60 and Y magnet 62, Y linear motor 58 moves stage 28 along guiding portion 56 of guide bar 55. Y linear motor 58 utilizes Lorenz force to move stage 28. However, many different types of driving devices, including a combination of a DC motor and a driving shaft, may be used to move stage 28 in the Y direction instead of Y linear motor 58. A set of bearings (not shown) positioned at the bottom of stage 28 supports stage 28 above base member 52 and allows stage 28 to move along guiding portion 56 freely. Many different types of bearings, including air bearings and magnetic bearings, may be used to support stage 28 above base member 52.

While stage 28 is movable in the Y direction along guiding portion 56, guide bar 55 is movable in the X direction. Accordingly, stage 28 moves in the X direction as guide bar 55 moves in the X direction. To move guide bar 55 in the X direction, wafer stage assembly 50 includes a pair of X linear motors 68. Each X linear motor 68 includes an X coil 64 and an X magnet 66. As best shown in FIGS. 3 and 4, one of X coils 64 is connected one side of guiding portion 56 while the other is connected to a holder 74, which in turn is connected to the other side of guiding portion 56. X magnets 66, on the other hand, are connected to the ground or a reaction-force system (not shown) of exposure apparatus 20. By controlling the electromagnetic interaction between X coils 64 and X magnets 66, X linear motors 68 move guide bar 55, and thereby stage 28, in the X direction. X linear motors 68 utilize Lorenz force to move guide bar 55. However, many different types of driving devices, including a combination of a DC motor and a driving shaft, may be used to move guide bar 55 in the X direction instead of X linear motors 68 A set of bearings (not shown) positioned at the bottom of guiding portion 56 supports guide bar 55 above base member 52 and allows guide bar 55 to move in the X direction freely. Many different types of bearings, including air bearings and magnetic bearings, may be used to support guide bar 55 above base member 52.

Y linear motor 58 moves stage 28 along guiding portion 56 by applying a force on stage 28 in the +Y direction (or −Y direction). Y motor 58 also exerts a reaction force of equal magnitude on guide bar 55 in the −Y direction (or +Y direction). To cancel this reaction force exerted on guide bar 55 by stage 28, guide assembly 54 includes an actuator component 70 illustrated in FIGS. 4 and 5. Actuator component 70 interacts with a corresponding actuator component 72 of wafer stage assembly 50 and applies a compensating force on guide bar 55 to cancel the reaction force.

Actuator component 70 is positioned within holder 74 of guide bar 55. On the other hand, corresponding actuator component 72 is connected to and extends parallel to X magnet 66 on the side of holder 74. Preferably, actuator component 70 is a pair of E cores 71 spaced apart from each other in the Y direction and corresponding actuator component 72 is an I core positioned between the pair of E cores 71. The electromagnetic interaction between I core 72 and one of E cores 71 applies a compensating force in the +Y direction while the electromagnetic interaction between I core 72 and the other of E cores 71 applies a compensating force in the −Y direction.

Figure 5:
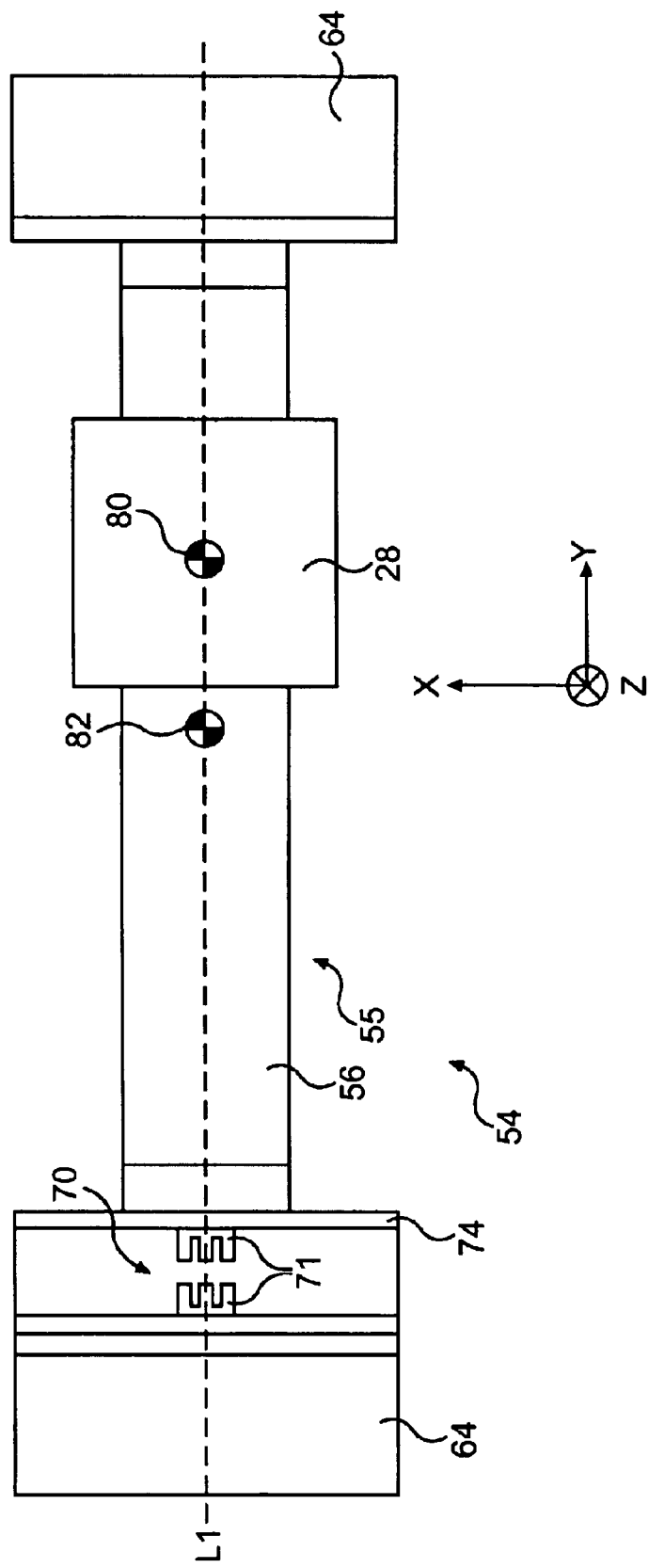
FIG. 5 is a bottom view of a first embodiment of a guide assembly.

As illustrated in FIG. 5, actuator component 70 (the portion where the force of actuator component 70 acts on guide bar 55) is aligned with the center of gravity 80 of stage 28 in the Y direction as indicated by a line L1. In other words, actuator component 70 and the center of gravity 80 of stage 28 have the same X position regardless of the position of stage 28 along guiding portion 56. In addition, actuator component 70 is aligned with Y linear motor 58 in the Y direction along line L1. This alignment of actuator component 70, the center of gravity 80 of stage 28, and Y linear motor 58 ensures that the compensating force applied on guide bar 55 cancels the reaction force exerted on guide bar 55 by stage 28 without producing any torque around the Z axis.

Actuator component 70 (the portion where the force of actuator component 70 acts on guide bar 55) is also aligned with the center of gravity 82 of guide bar 55 in the Y direction as indicated by line L1 to control the position of guide bar in the Y direction. In other words, actuator component 70 and the center of gravity 82 of guide bar 55 have the same X position. Even when stage 28 exerts no reaction force on guide bar 55, extraneous forces (e.g., vibration) may be exerted on guide bar 55 in the Y direction. Actuator component 70 applies a force on guide bar 55 to cancel these extraneous forces and therefore maintains and controls the position of guide bar 55 in the Y direction. Accordingly, actuator component 70 applies both a compensating force to cancel a reaction force exerted on guide bar 55 by stage 28 and a force to control the position of guide bar 55 in the Y direction. The alignment of actuator component 70 and the center of gravity 82 of guide bar 55 ensures that the force controlling the position of guide bar 55 in the Y direction produces no torque around the Z axis.

Figure 6:
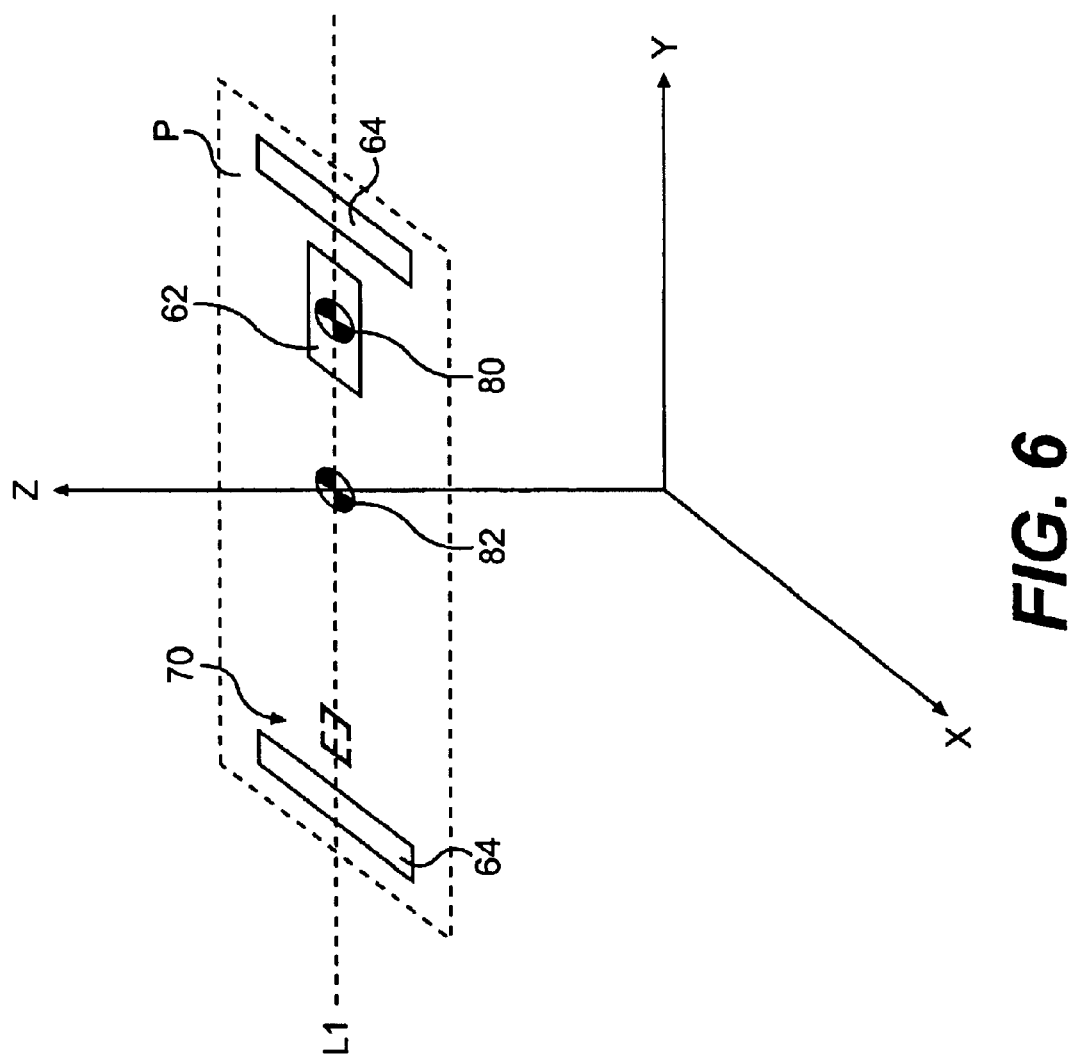
FIG. 6 is a schematic view illustrating the axial position of various components of the guide assembly shown in FIG. 5.

As schematically illustrated in FIG. 6, actuator component 70 (the portion where the force of actuator component 70 acts on guide bar 55), the center of gravity 82 of guide bar 55, the center of gravity 80 of stage 28, and y magnet 62 are positioned in a plane P parallel to the X and Y directions (i.e., a plane parallel to the X-Y plane). In other words, actuator component 70, the center of gravity 82 of guide bar 55, the center of gravity 80 of stage 28, and Y magnet 62 all have the same Z position. Positioning actuator component 70, the center of gravity 82 of guide bar 55, the center of gravity 80 of state 28, and Y magnet 62 in plane P ensures that the forces exerted and applied on guide bar 55 in the Y direction by stage 28 and actuator component 70 produce no torque around the X axis.

Moreover, X coils 64 are also positioned in plane P as schematically illustrated in FIG. 6. Positioning X coils 64 in plane P ensures that the forces applied on guide bar 55 in the X direction by X linear motors 68 produce no torque around the Y axis. The magnitudes of forces applied on guide bar 55 by X linear motors 68 are controlled such that no torque around the Z axis is produced. For example, when the center of gravity 80 of stage 28 is positioned to the right of the center of gravity 82 of guide bar 55, X linear motor 68 on the right side of guide assembly 54 applies a greater force than X linear motor 68 on the left side of guide assembly 54.

Figure 11:
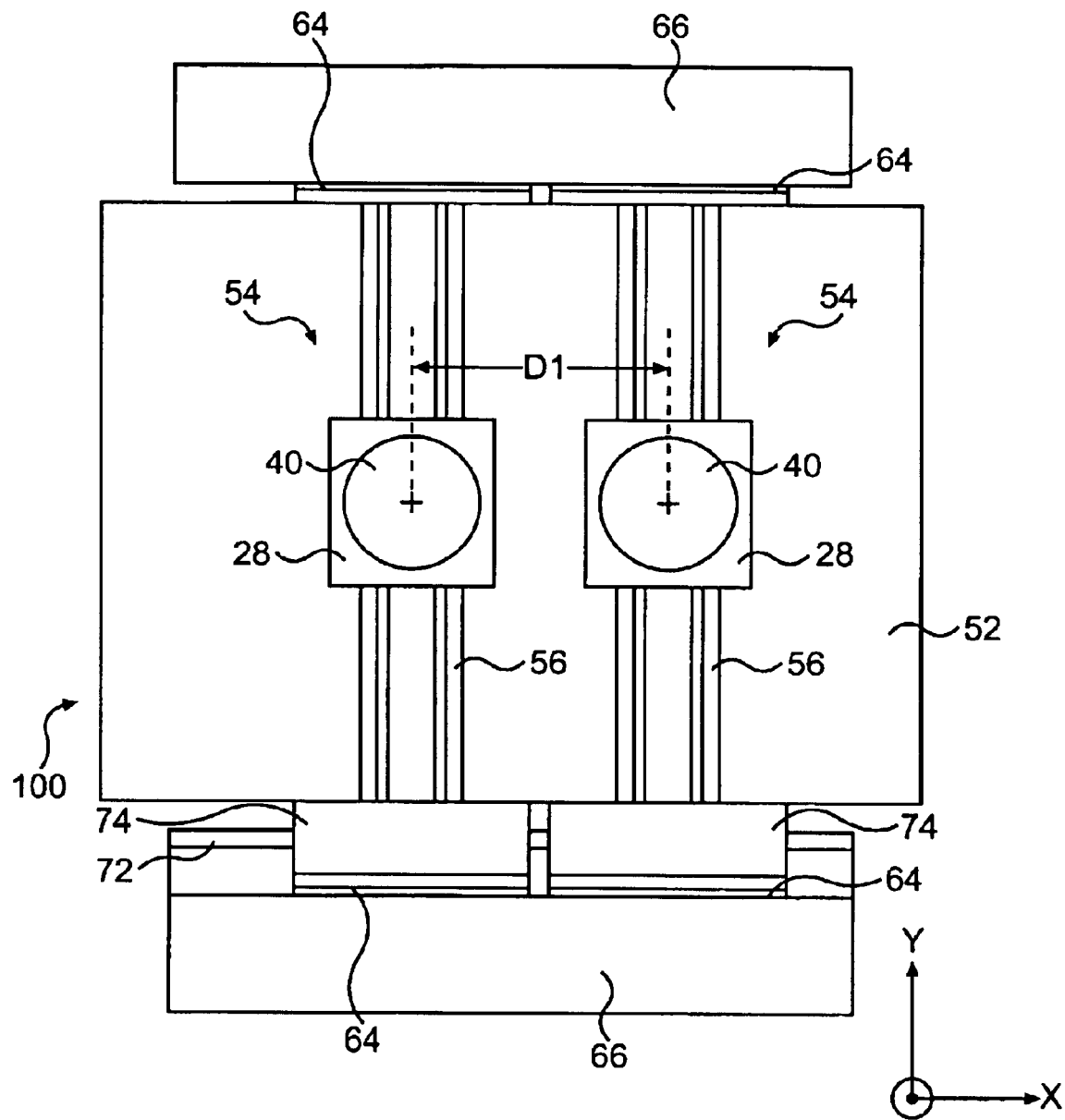
FIG. 11 is a top view of a wafer stage assembly having a pair of guide assemblies shown in FIG. 5.

FIG. 11 illustrates a wafer stage assembly 100 having a pair of guide assemblies 54. Wafer stage assembly 100 may replace wafer stage assembly 50 illustrated in FIGS. 2–4. Both guide assemblies 54 share common X magnets 66. The minimum distance between stages 28 is indicated by D1. While one of the guide assemblies 54 is involved in an exposure step, the other guide assembly 54 may perform other preparation steps before the exposure step. Accordingly, a wafer stage assembly having a pair of guide assemblies reduces the time gap between successive exposure steps and increases the wafer throughput over a wafer stage assembly having a single guide assembly.

Figure 7:
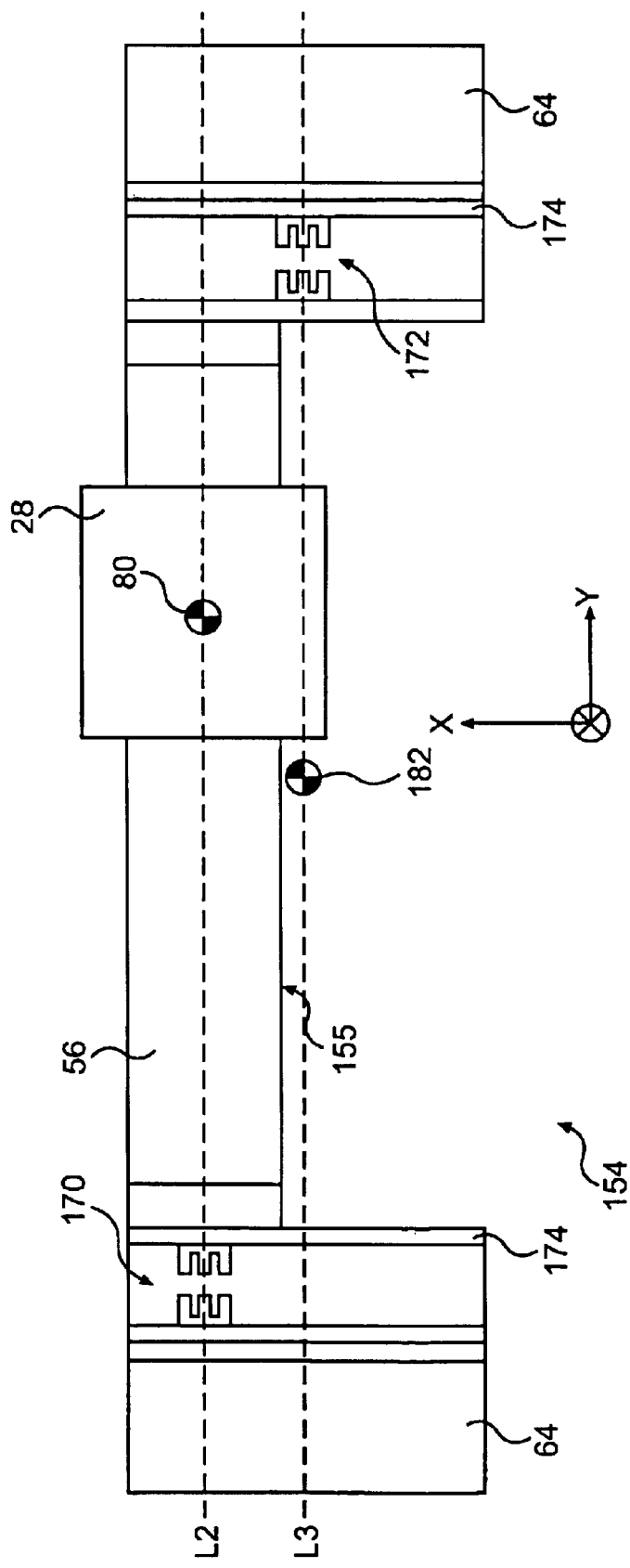
FIG. 7 is a bottom view of a second embodiment of a guide assembly.

FIG. 7 illustrates a second embodiment of a guide assembly according to the present invention. The second embodiment of a guide assembly described below may replace guide assembly 54 in wafer stage assembly 50 illustrated in FIGS. 2–4. Unlike the first embodiment, guide bar 155 of guide assembly 154 includes a pair of holders 174 connected off-center to guiding portion 56. Accordingly, the center of gravity 80 of stage 28 and the center of gravity 182 of guide bar 155 are spaced apart from each other in the X direction. Although FIG. 7 shows the center of gravity 182 of guide bar 155 outside guiding portion 56, it may be positioned within guiding portion 56.

Figure 12:
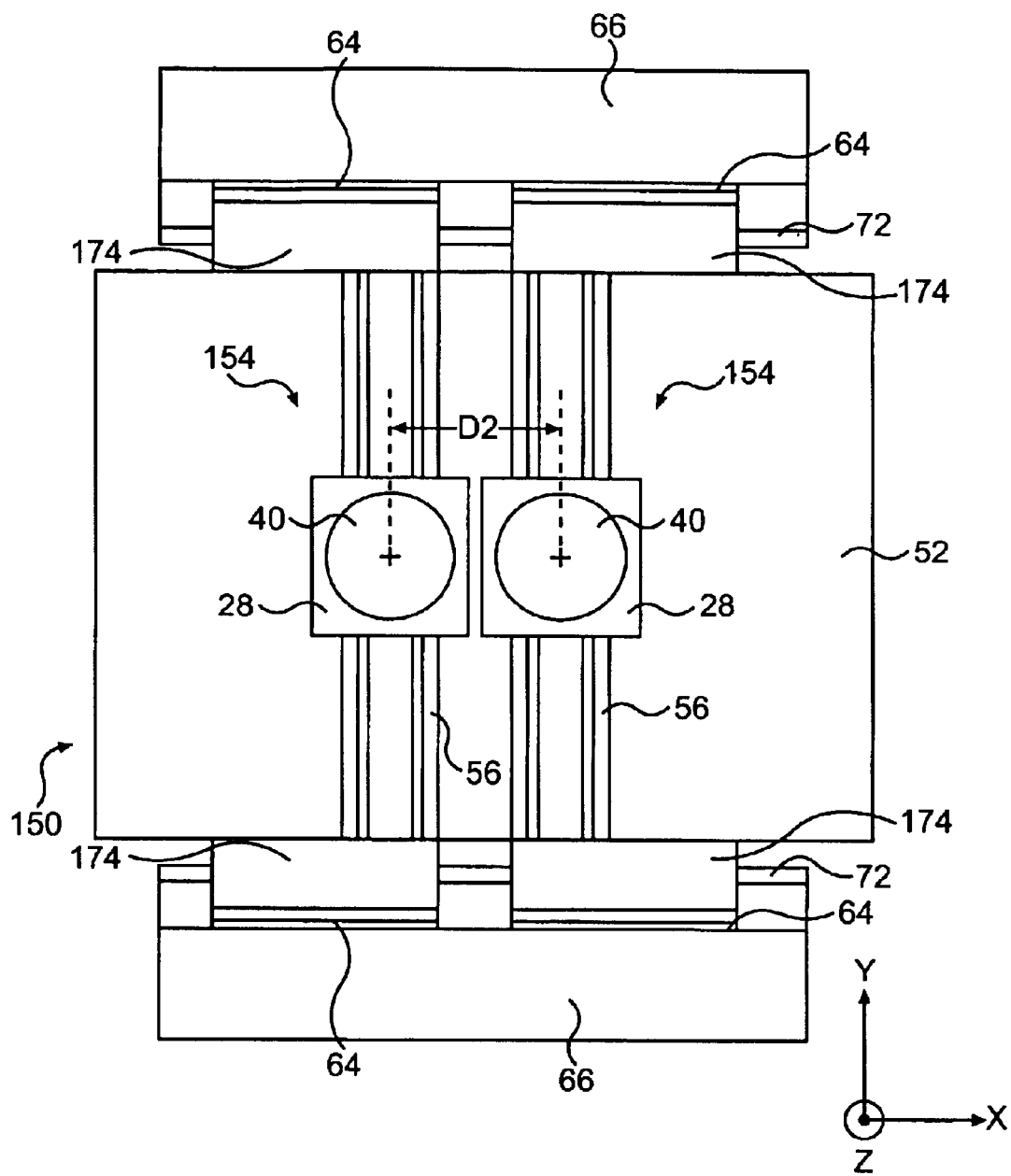
FIG. 12 is a top view of a wafer stage assembly having a pair of guide assemblies shown in FIG. 7.

As illustrated in FIG. 7, guide assembly 154 includes a first actuator component 170 positioned within holder 174 connected to one side of guiding portion 56 and a second actuator component 172 positioned within holder 174 connected to the other side of guiding portion 56. Corresponding actuator components 72 are connected to and extend parallel to X magnets 66 (FIG. 12). Preferably, each of first and second actuator components 170 and 172 is a pair of E cores spaced apart from each other in the Y direction and corresponding actuator components 72 are I cores positioned between the E cores.

First actuator component 170 (the portion where the force of first actuator component 170 acts on guide bar 155) is aligned with the center of gravity 80 of stage 28 in the Y direction as indicated by a line L2 while second actuator component 172 (the portion where the force of second actuator component 172 acts on guide bar 155) is aligned with the center of gravity 182 of guide bar 155 in the Y direction as indicated by a line L3. In other words, first actuator component 170 and the center of gravity 80 of stage 28 have the same X position. Also, second actuator component 172 and the center of gravity 182 of guide bar 155 have the same X position. As explained above, the alignment of first actuator component 170 and the center of gravity 80 of stage 28 in the Y direction ensures that the compensating force applied on guide bar 155 by first actuator component 170 cancels the reaction force exerted on guide bar 155 by stage 28 without producing any torque around the Z axis. Also as explained above, the alignment of second actuator component 172 and the center of gravity 182 of guide bar 155 in the Y direction ensures that the force applied on guide bar 155 by second actuator component 172 to control the position of guide bar 155 in the Y direction produces no torque around the Z axis.

Manufacturing guide assembly 154 is easier than guide assembly 54 because the center of gravity 80 of stage 28 and the center of gravity 182 of guide bar 155 are spaced part from each other in the X direction. Furthermore, spacing the center of gravity 80 of stage 28 and the center of gravity 182 of guide bar 155 in the X direction provides designers more freedom to modify other components of guide bar 155.

Figure 8:
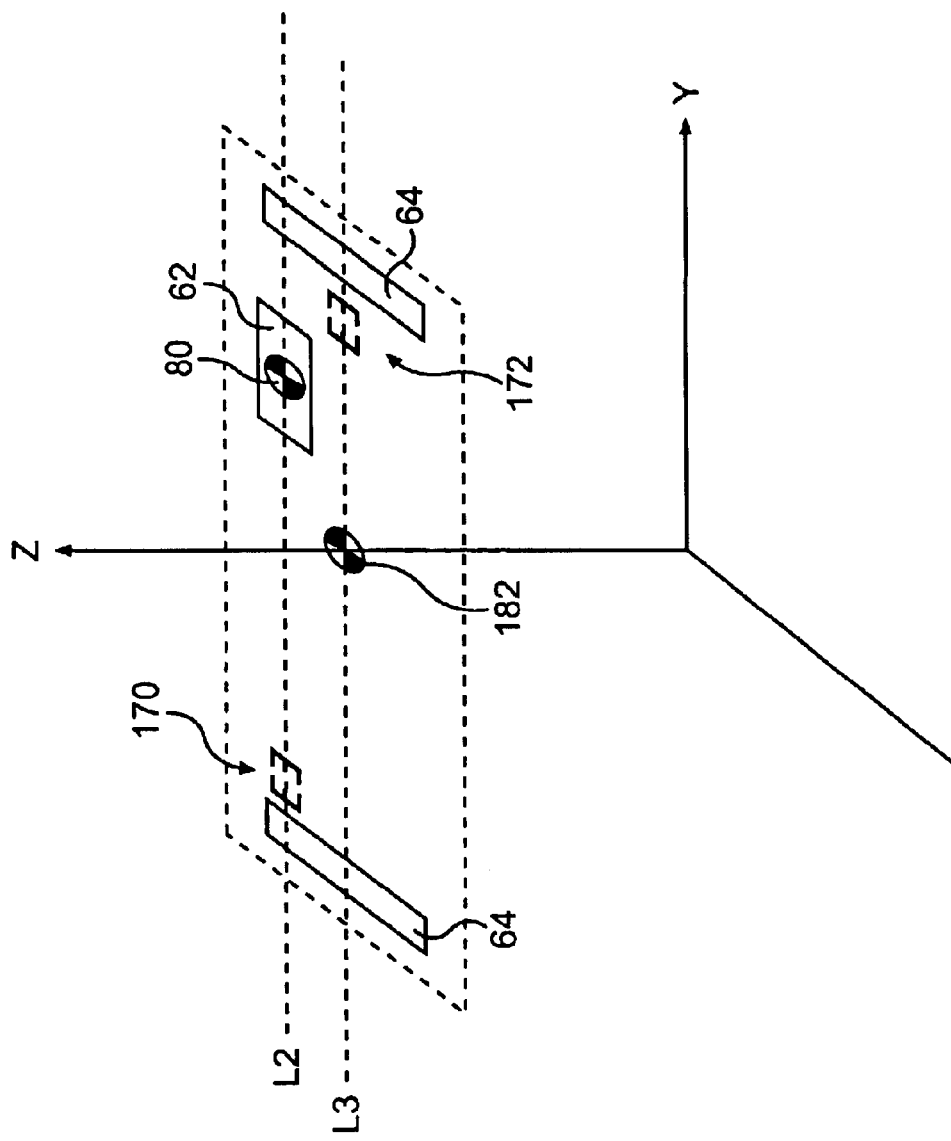
FIG. 8 is a schematic view illustrating the axial position of various components of the guide assembly shown in FIG. 7.

As schematically illustrated in FIG. 8, first and second actuator components 170 and 172 (the portions where the forces of first and second actuator components 170 and 172 act on guide bar 155, respectively), the center of gravity 80 of stage 28, the center of gravity 182 of guide bar 155, X coils 64, and Y magnet 62 are all positioned in plane P parallel to the X and Y directions (i.e., a plane parallel to the X-Y plane) and therefore have the same Z position. Accordingly, as explained above, the forces applied on guide bar 155 in the Y direction by first and second actuator components 170 and 172, respectively, produce no torque around the X axis. Also, as explained above, the forces applied on guide bar 155 in the X direction by X motors 68 produce no torque around the Y axis.

FIG. 12 illustrates a wafer stage assembly 150 having a pair of guide assemblies 154. Wafer stage assembly 150 may replace wafer stage assembly 50 illustrated in FIGS. 2–4. Because holders 174 are connected off-center to guiding portion 56, the minimum distance D2 between stages 28 is less than D1 shown in FIG. 11. Accordingly, wafer stage assembly 150 can be made smaller in the X direction than stage assembly 50 and a more compact exposure apparatus 20 (FIG. 1) in the X direction is possible. However, because holders 174 are connected to both sides of guiding portion 56, guide assembly 154 is bigger in the Y direction than guide assembly 54.

Figure 9:
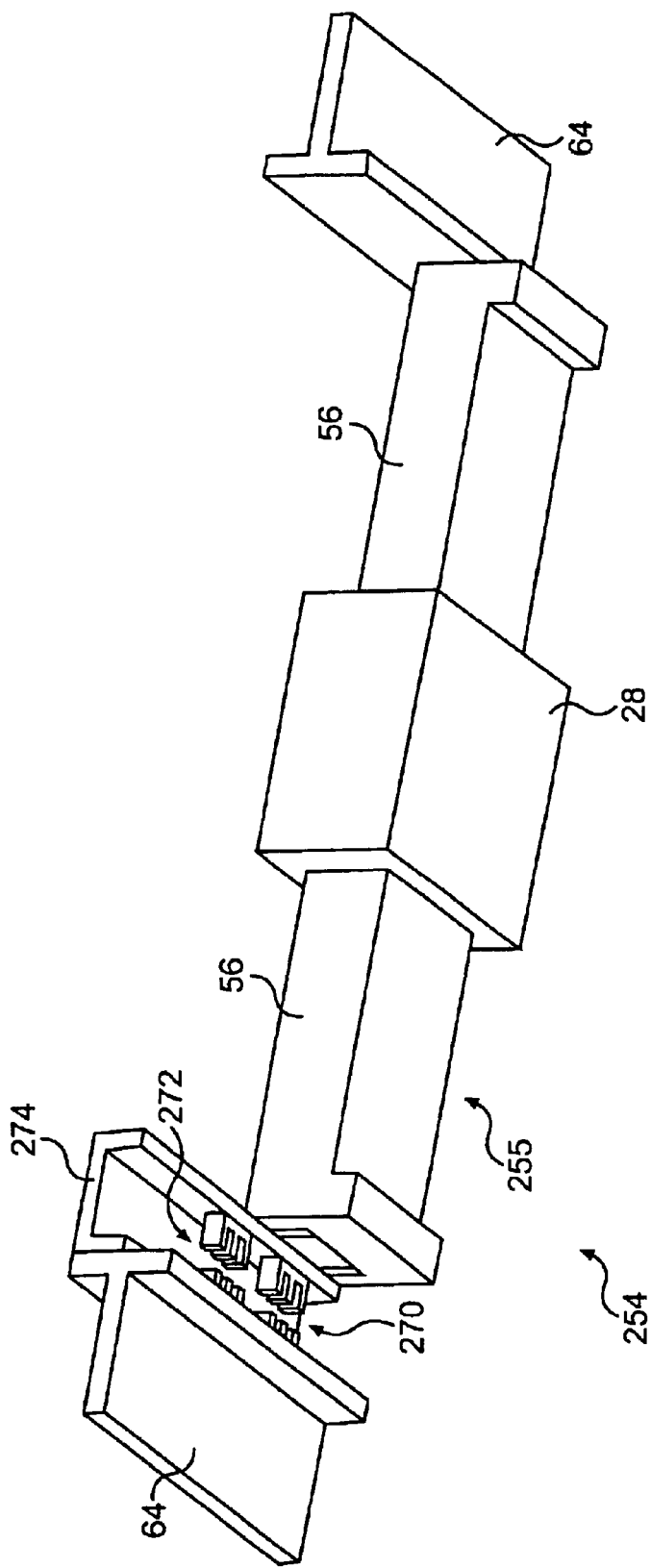
FIG. 9 is a perspective bottom view of a third embodiment of a guide assembly.
Figure 10:
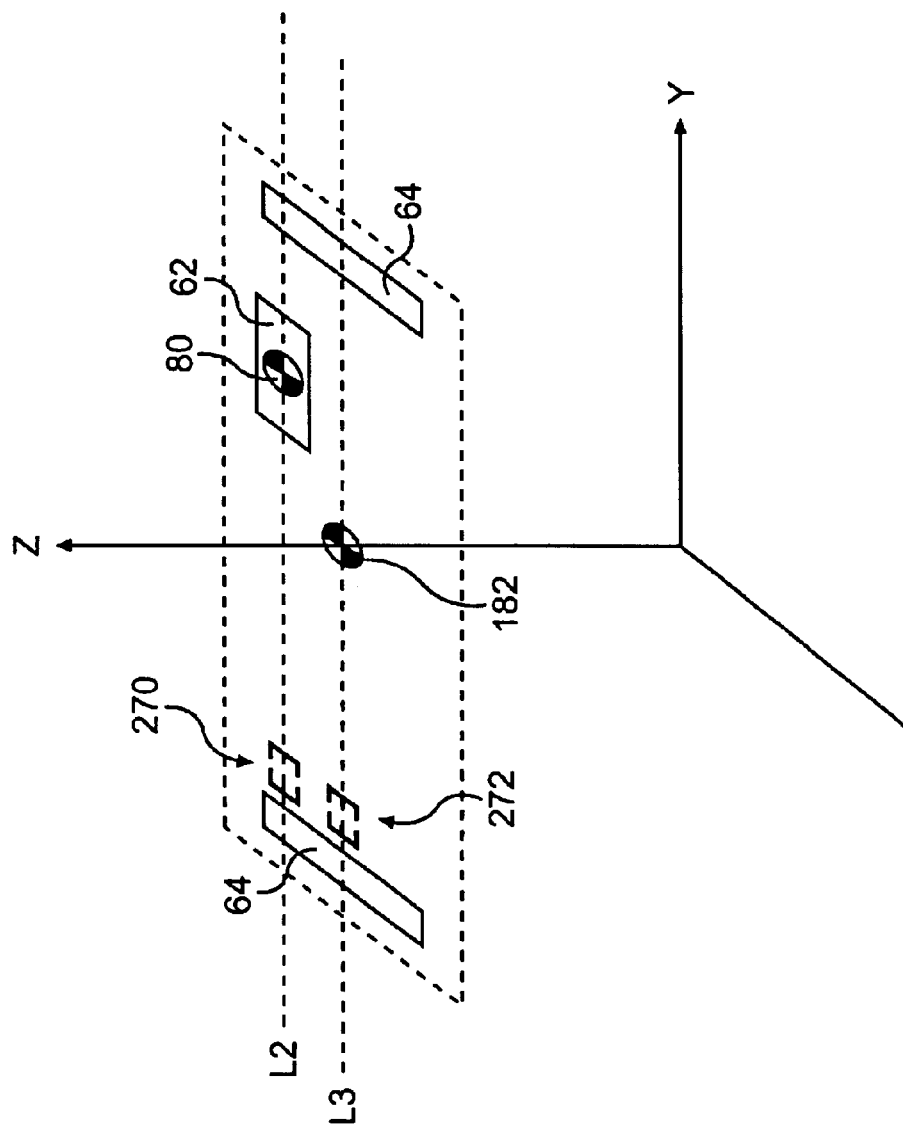
FIG. 10 is a schematic view illustrating the axial position of various components of the guide assembly shown in FIG. 9.

FIG. 9 illustrates a third embodiment of a guide assembly according to the present invention. The third embodiment of a guide assembly described below may replace guide assembly 54 in wafer stage assembly 50 illustrated in FIGS. 2–4. Instead of a pair of holders 174, guide assembly 254 has one holder 274 attached to one side of guiding portion 56 and both first and second actuator components 270 and 272 are positioned within holder 274. Accordingly, guide assembly 254 is smaller in the Y direction than guide assembly 154. All other aspects of guide assembly 254 are the same as guide assembly 154 as schematically illustrated in FIG. 10.

Figure 13:
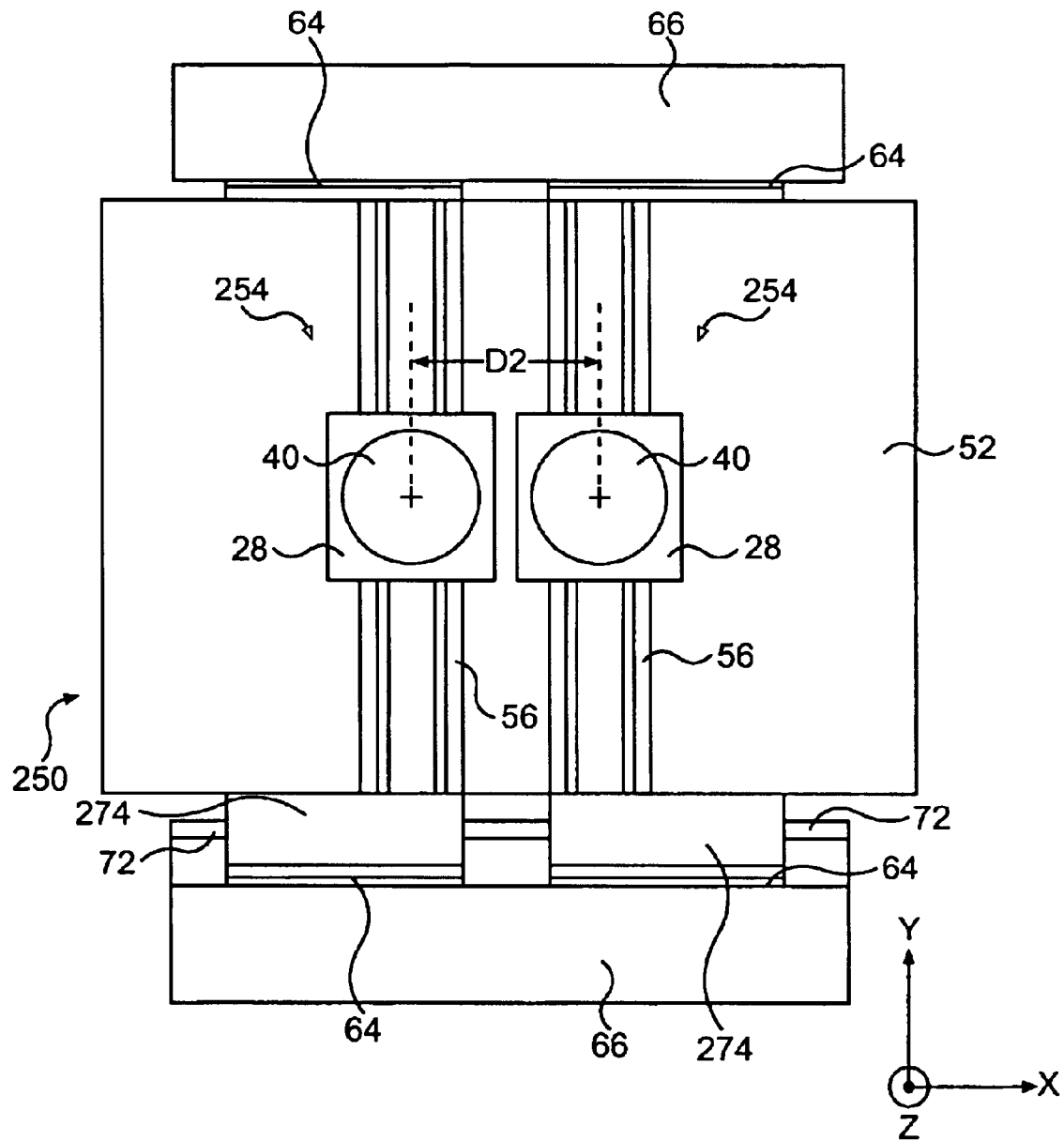
FIG. 13 is a top view of a wafer stage assembly having a pair of guide assemblies shown in FIG. 9.

FIG. 13 illustrates a wafer stage assembly 250 having a pair of guide assemblies 254. Wafer stage assembly 250 may replace wafer stage assembly 50 illustrated in FIGS. 2–4. Because guide assembly 254 is smaller in the Y direction than guide assembly 154, wafer stage assembly 250 can be made smaller in the Y direction than stage assembly 150 and a more compact exposure apparatus 20 (FIG. 1) in the Y direction is possible.

Alternative to positioning an actuator component (or actuator components) within a holder (or holders) and providing a corresponding actuator component (or corresponding actuator components) to an X magnet (or X magnets), a different arrangement may be used in the present invention. For example, actuator component(s) 70, 170, 172, 270, and 272 and corresponding actuator component(s) 72 may change their positions with each other by connecting actuator components 70, 170, 172, 270, and 272 to X magnet(s) 66 and connecting corresponding actuator component(s) 72 to holder(s) 74, 174, and 274, respectively. Further, many different types of driving devices, including a voice coil motor utilizing Lorenz force, may be used to apply the compensating force or driving force to move guide bars 55, 155, and 255 in the Y direction instead of E cores 71 and I core 72.

A number of different types of exposure apparatus 20 may be used in conjunction with any of the wafer stage assemblies described above. For example, exposure apparatus 20 can be used as a scanning type photolithography system which exposes the pattern from reticle 36 onto wafer 40 with both of them moving synchronously. In a scanning type lithographic device, reticle 36 is moved perpendicular to an optical axis of lens assembly 26 by reticle stage 24, and wafer 40 is moved perpendicular to an optical axis of lens assembly 26 by wafer stage 28. Scanning of reticle 36 and wafer 40 occurs while both of them are moving synchronously.

Alternatively, exposure apparatus 20 can be a step-and-repeat type photolithography system that exposes reticle 36 while reticle 36 and wafer 40 are stationary. In the step and repeat process, wafer 40 is in a constant position relative to reticle 36 and lens assembly 26 during the exposure of an individual field. Subsequently, between consecutive exposure steps, wafer 40 is consecutively moved by wafer stage 28 perpendicular to the optical axis of lens assembly 26 so that the next field of semiconductor wafer 40 is brought into position relative to lens assembly 26 and reticle 36 for exposure. Following this process, the images on reticle 36 are sequentially exposed onto the fields of wafer 40 so that the next field of semiconductor wafer 40 is brought into position relative to lens assembly 26 and reticle 36.

However, the use of exposure apparatus 20 provided herein is not limited to a photolithography system for a semiconductor manufacturing. Exposure apparatus 20, for example, can be used as an LCD photolithography system that exposes a liquid crystal display device pattern onto a rectangular glass plate or a photolithography system for manufacturing a thin film magnetic head.

Illumination source 30 can be g-line (436 nm), i-line (365 nm), KrF excimer laser (248 nm), ArF excimer laser (193 nm) and $F_2$ laser (157 nm). Alternatively, illumination source 30 can also use charged particle beams such as x-ray and electron beam. For instance, in the case where an electron beam is used, thermionic emission type lanthanum hexaboride ($LaB_6$) or tantalum (Ta) can be used as an electron gun.

With respect to lens assembly 26, when far ultra-violet rays such as the excimer laser is used, glass materials such as quart and fluorite that transmit far ultra-violet rays is preferably used. When the $F_2$ type laser or x-ray is used, lens assembly 26 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure apparatus that employs vacuum ultra-violet radiation (VUV) of wavelength 200 nm or lower, use of the catadioptric type optical system can be considered. Examples of the catadioptric type of optical system include Japan Patent Application Disclosure No. 8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No.10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorenz force or reactance force. Additionally, the stage could move along a guide, or it could be a guideless type stage which uses no guide. The disclosures in U.S. Pat. Nos. 5,623,853 and 5,528,118 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 14:
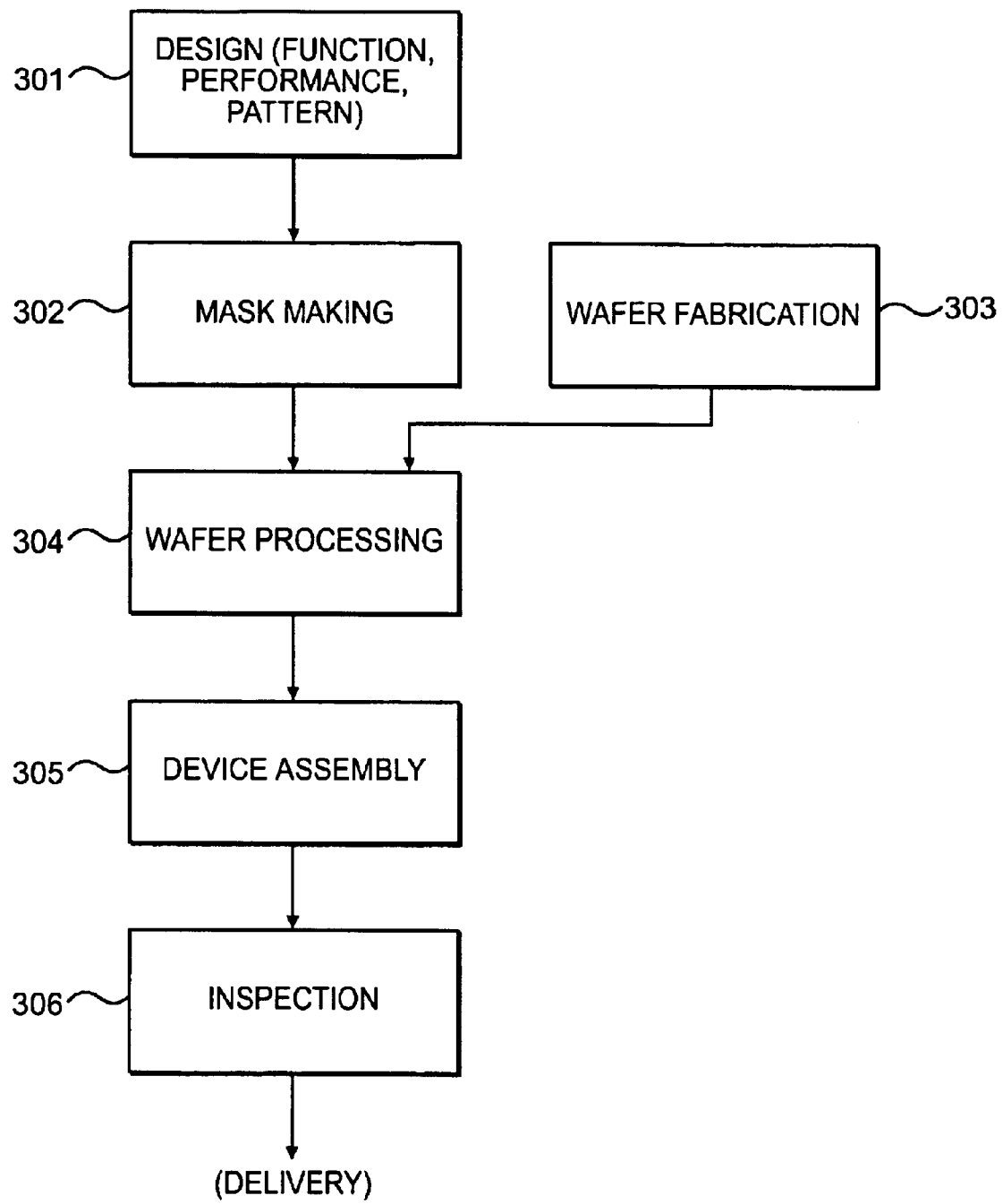
FIG. 14 is a flow chart outlining a process for manufacturing a semiconductor device consistent with the principles of the present invention.

Further, semiconductor devices can be fabricated using the above described systems, by the process shown generally in FIG. 14. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 15:
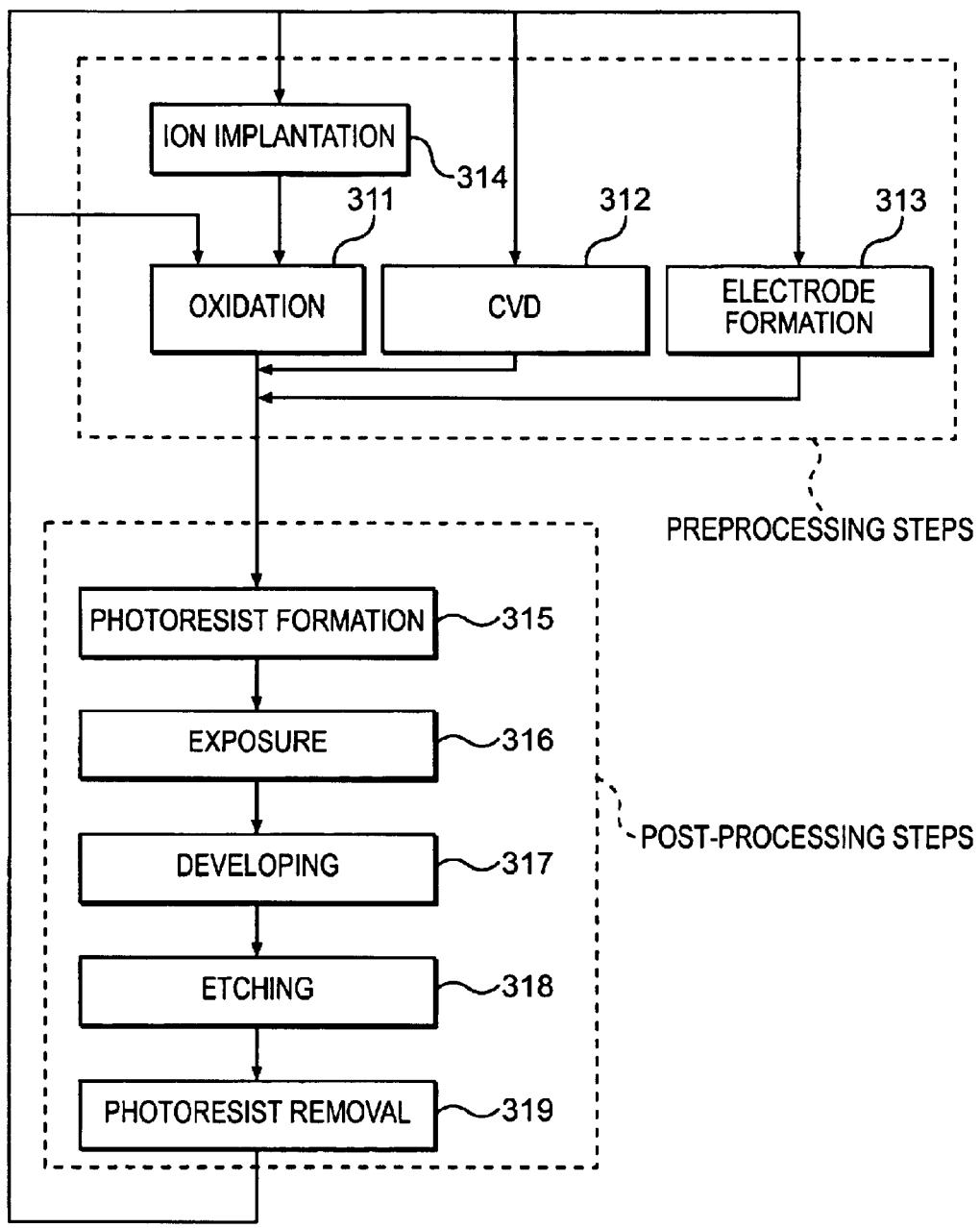
FIG. 15 is a flow chart outlining the process of FIG. 14 in more detail.

FIG. 15 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the stage assembly, the exposure apparatus, the material chosen for the present invention, the construction of the photolithography systems, and the method described as well as other aspects of the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A stage assembly comprising:
   a guide assembly including:
      a guide bar movable in a first direction, the guide bar having a center of gravity and a guiding portion;
      a stage movable along the guiding portion of the guide bar in a second direction substantially perpendicular to the first direction and exerting a reaction force on the guide bar in the second direction, the stage having a center of gravity substantially positioned in a plane parallel to the first and second directions, the plane parallel to the first and second directions having the center of gravity of the guide bar substantially positioned therein; and an actuator component positioned on the guide bar substantially in the plane parallel to the first and second directions and aligned with the center of gravity of the stage in the second direction to apply a compensating force on the guide bar to cancel the reaction force exerted by the stage.

2. The stage assembly of claim 1, wherein the center of gravity of the stage and the center of gravity of the guide bar are aligned with each other in the second direction and the actuator component applies a force on the guide bar to control a position of the guide bar in the second direction.

3. The stage assembly of claim 2, wherein the actuator component is a pair of E cores spaced apart from each other in the second direction.

4. The stage assembly of claim 2, comprising a pair of the guide assemblies spaced apart from each other in the first direction.

5. The stage assembly of claim 1, wherein the center of gravity of the stage and the center of the gravity of the guide bar are spaced apart from each other in the first direction and the guide assembly further includes another actuator component positioned substantially in the plane parallel to the first and second directions and aligned with the center of gravity of the guide bar in the second direction to apply a force on the guide bar to control a position of the guide bar in the second direction.

6. The stage assembly of claim 5, wherein the actuator component is positioned on one side of the guide bar and the another actuator component is positioned on the other side of the guide bar.

7. The stage assembly of claim 6, wherein each of the actuator component and the another actuator component is a pair of E cores spaced apart from each other in the second direction.

8. The stage assembly of claim 6, comprising a pair of the guide assemblies spaced apart from each other in the first direction.

9. The stage assembly of claim 5, wherein the actuator component and the other actuator component are positioned on one side of the guide bar.

10. The stage assembly of claim 9, wherein each of the actuator component and the another actuator component is a pair of E cores spaced apart from each other in the second direction.

11. The stage assembly of claim 9, comprising a pair of the guide assemblies spaced apart from each other in the first direction.

12. An exposure apparatus comprising:
an illumination system configured to irradiate energy; and
a stage assembly configured to carry an object on a path of the radiant energy, the stage assembly conprising;
a guide assembly including:
a guide bar movable in a first direction, the guide bar having a center of gravity and a guiding portion;
a stagbe movable along the guding portion of the guide bar in a second direction substantially perpendicular to the first direction and exerting a reaction force on the guide bar in the second direction, the stage having a cneter of gravity substantially positioned in a plane parallel to the first and second directions, the plane parallel to the first and second directions having the center of gravity of the guide bar substantially positioned therin; and an actuactor component positioned on the guide bar substantially in the plan parallel to the first and second directions and aligned with the center of gravity of the stage in the second direction to apply a conpensating force on the guide bar to cancel the reaction force exerted by the stage.

13. A stage assembly comprising:
a guide assembly including:
a guide bar movable in a first direction, the guide bar having a center of gravity and a guiding portion;
a stage movable along the guiding portion of the guide bar in a second direction substantially perpendicular to the first direction and exerting a reaction force on the guide bar, the stage having a center of gravity spaced apart from the center of gravity of the guide bar in the first direction;
a first actuator component positioned on the guide bar and aligned with the center of gravity of the stage in the second direction to apply a compensating force on the guide bar to cancel the reaction force exerted by the stage; and
a second actuator component positioned on the guide bar and aligned with the center of gravity of the guide bar in the second direction to apply a force on the guide bar to control a position of the guide bar in the second direction.

14. The stage assembly of claim 14, wherein the first actuator component is positioned on one side of the guide bar and the second actuator component is positioned on the other side of the guide bar.

15. The stage assembly of claim 15, wherein each of the first and second actuator components is a pair of E cores spaced apart from each other in the second direction.

16. The stage assembly of claim 15, comprising a pair of the guide assemblies spaced apart from each other in the first direction.

17. The stage assembly of claim 14, wherein the first and second actuator components are positioned on one side of the guide bar.

18. The stage assembly of claim 18, wherein each of the first and second actuator components is a pair of E cores spaced apart from each other in the second direction.

19. The stage assembly of claim 18, comprising a pair of the guide assemblies spaced apart from each other in the first direction.

20. A stage assembly comprising:
a guide assembly including:
a first moving member movable in a first direction, the first moving member having a center of gravity;
a second moving member movable in a second direction substantially perpendicular to the first direction, the second moving member having a center of gravity substantially positioned in a plane parallel to the first and second directions, the plane parallel to the first and second directions having the center of gravity of the first moving member substantially positioned therein; and
an actuator, at least part of the actuator being positioned on the first moving member, the actuator generating a force acting on the first moving member in the second direction, wherein a portion where the force acts on the first moving member is substantially positioned in the plane parallel to the first and second directions and aligned with the center of gravity of the second moving member in the second direction.

21. The stage assembly of claim 20, wherein:
the actuator, the force acting on the first moving member, and the portion where the force acts on the first moving member are, respectively, a first actuator, a first force, and a first portion;

the center of gravity of the first moving member and the center of gravity of the second moving member are spaced apart from each other in the first direction; and the guide assembly further comprises a second actuator, at least part of the second actuator being positioned on the first moving member, the second actuator generating a second force acting on the first moving member in the second direction, wherein a second portion where the second force acts on the first moving member is substantially positioned in the plane parallel to the first and second directions and aligned with the center of gravity of the first moving member in the second direction.

22. A method for driving a stage assembly comprising a first moving member and a second moving member, the method comprising the steps of:

driving the first moving member in a first direction;

driving the second moving member in a second direction substantially perpendicular to the first direction; and applying a force on the first moving member at a portion in the second direction, wherein a center of gravity of the first moving member and a center of gravity of the second moving member are substantially positioned in a plane parallel to the first and second directions, and wherein the portion is substantially positioned in the plane parallel to the first and second directions and aligned with the center of gravity of the second moving member in the second direction.

23. The method of claim 22, wherein:

the force applied on the first moving member and the portion are, respectively, a first force and a first portion;

the center of gravity of the first moving member and the center of gravity of the second moving member are spaced apart from each other in the first direction; and the method further comprises the step of applying a second force on the first moving member at a second portion in the second direction, the second portion being substantially positioned in the plane parallel to the first and second directions and aligned with the center of gravity of the first moving member in the second direction.

* * * * *

UNITED STATES PATENT AND TRADEMARK OFFICE
CERTIFICATE OF CORRECTION

PATENT NO. : 6,844,694 B2
DATED : January 18, 2005
INVENTOR(S) : Michael Binnard It is certified that error appears in the above-identified patent and that said Letters Patent is hereby corrected as shown below:

Column 11,
Line 63, "cneter" should read -- center --.

Column 12,
Line 2, "plan" should read -- plane --.
Line 26, "claim 14" should read -- claim 13 --.
Lines 30 and 33, "claim 15" should read -- claim 14 --.
Line 36, "claim 14" should read -- claim 13 --.
Lines 39 and 42, "claim 18" should read -- claim 17 --.

Signed and Sealed this

Tenth Day of May, 2005

JON W. DUDAS
*Director of the United States Patent and Trademark Office*